(12) United States Patent
Chang et al.

(10) Patent No.: US 8,772,828 B2
(45) Date of Patent: *Jul. 8, 2014

(54) TRENCH POLY ESD FORMATION FOR TRENCH MOS AND SGT

(71) Applicants: Hong Chang, Saratoga, CA (US); John Chen, Palo Alto, CA (US)

(72) Inventors: Hong Chang, Saratoga, CA (US); John Chen, Palo Alto, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/911,871

(22) Filed: Jun. 6, 2013

(65) Prior Publication Data

US 2013/0299872 A1 Nov. 14, 2013

Related U.S. Application Data

(63) Continuation of application No. 13/010,427, filed on Jan. 20, 2011, now Pat. No. 8,476,676.

(51) Int. Cl.
*H01L 29/78* (2006.01)

(52) U.S. Cl.
USPC .................. 257/173; 257/330; 257/E29.262

(58) Field of Classification Search
USPC ............... 257/173, 328, 330, E29.262
See application file for complete search history.

(56) References Cited

U.S. PATENT DOCUMENTS

| 6,489,204 | B1 | 12/2002 | Tsui |
| 7,345,342 | B2 * | 3/2008 | Challa et al. .................. 257/341 |
| 7,544,571 | B2 | 6/2009 | Park |
| 7,772,642 | B2 | 8/2010 | Marchant |
| 7,859,047 | B2 | 12/2010 | Kraft et al. |
| 7,956,410 | B2 | 6/2011 | Hsieh |
| 7,989,887 | B2 | 8/2011 | Hsieh |
| 8,084,304 | B2 | 12/2011 | Pan et al. |
| 8,476,676 | B2 * | 7/2013 | Chang et al. .................. 257/173 |
| 2007/0075362 | A1 | 4/2007 | Wu |
| 2008/0070365 | A1 | 3/2008 | Park |
| 2009/0020810 | A1 | 1/2009 | Marchant |
| 2009/0057754 | A1 | 3/2009 | Kraft et al. |

(Continued)

FOREIGN PATENT DOCUMENTS

| CN | 10150557 | 8/2009 |
| JP | 59069943 | 4/1984 |

OTHER PUBLICATIONS

Final Office Action mailed date Jun. 27, 2012, issued for U.S. Appl. No. 12/802,185.
Non-Final Office Action mailed date Mar. 7, 2012, issued for U.S. Appl. No. 12/802,185.

(Continued)

*Primary Examiner* — Minh-Loan T Tran
(74) *Attorney, Agent, or Firm* — Joshua D. Isenberg; JDI Patent

(57) ABSTRACT

A semiconductor device includes a semiconductor material disposed in a trench with polysilicon lining at least the bottom of the trench. The semiconductor material includes differently doped regions configured as a PNP or NPN structure formed in the trench with differently doped regions located side by side across a width of the trench. It is emphasized that this abstract is provided to comply with rules requiring an abstract that will allow a searcher or other reader to quickly ascertain the subject matter of the technical disclosure. It is submitted with the understanding that it will not be used to interpret or limit the scope or meaning of the claims.

9 Claims, 20 Drawing Sheets

(56) References Cited

U.S. PATENT DOCUMENTS

| | | |
|---|---|---|
| 2009/0140333 A1 | 6/2009 | Pan et al. |
| 2010/0123193 A1 | 5/2010 | Burke et al. |
| 2011/0121386 A1 | 5/2011 | Hsieh |
| 2011/0291186 A1 | 12/2011 | Yilmaz |

OTHER PUBLICATIONS

Office Action Dated Dec. 23, 2013 from Chinese State Intellectual Property Office (SIPO), for Chinese Patent Application No. 201210020335.0.

* cited by examiner

TRENCH POLY ESD FORMATION FOR TRENCH MOS AND SGT

CLAIM OF PRIORITY

This application is a Continuation of U.S. patent application Ser. No. 13/010,427, filed Jan. 20, 2011, the entire contents of which are incorporated herein by reference.

FIELD OF THE INVENTION

This invention relates generally to the cell structure and device configuration of semiconductor devices. More particularly, this invention relates to an improved configuration for manufacturing an electrostatic discharge (ESD) protection circuit integrated with a semiconductor power device with reduced number of masks for Trench metal-oxide-semiconductor filed effect transistor (MOSFET) and Shield Gate Trench (SGT) MOSFET.

BACKGROUND OF THE INVENTION

Electrostatic discharge (ESD) is the sudden and momentary electric current that flows between two objects at different electrical potentials caused by direct contact or induced by an electrostatic field. ESD is a serious issue in solid state electronics, such as integrated circuits (IC) and power transistors made from semiconductor materials such as silicon and insulating materials such as silicon dioxide. Either of these materials can suffer permanent damage when subjected to high voltages; as a result, there are now a number of antistatic devices that help prevent static build up.

On-chip ESD protection circuits with various diode structures have also been developed. With the shallower junction, much thinner gate oxide, salicide (self-aligned silicided) diffusion, Cu inter-connection and LLD (Light-Doped Drain) structure used on the MOSFET devices, ESD issue has become a main reliability concern of CMOS integrated circuits in sub-quarter-micron CMOS technology. To sustain a reasonable ESD stress for safe mass production, on-chip ESD protection circuits have to be added into the IC products.

Conventional power MOSFET devices with ESD protection circuits have also been developed. The ESD protection circuit diverts the ESD safely away from the rest of the MOSFET device. Conventional power MOSFET devices with ESD protection circuits generally have a layout and layer structures that require application of seven masks in typical manufacturing processes. These seven masks include a trench mask, an ESD mask, a body mask, a source mask, a contact mask, a metal mask and a passivation mask. With the seven masks required in the manufacturing processes, the processing steps are more complicated and time consuming In addition, the conventional method involves forming an additional poly layer above the silicon surface. Therefore, it may require additional poly deposition and two additional masks to pattern and form P-N junctions for the ESD structure. This adds cost and time in terms of extra masks and extra layers and extra steps. In addition, lithography machines and photoresists are expensive. The ESD protection circuit diverts the ESD safely away from the rest of the MOSFET device.

It is within this context that embodiments of the present invention arise.

BRIEF DESCRIPTION OF THE DRAWINGS

Other objects and advantages of the invention will become apparent upon reading the following detailed description and upon reference to the accompanying drawings in which:

FIGS. 2A to 2J, and FIGS. 2A' to 2J' are cross sectional diagrams illustrating fabrication of a normal Trench MOSFET with integrated electrostatic discharge (ESD) protection circuit according to another embodiment of the present invention.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention use the existing process flow for trench MOS and form electrostatic discharge (ESD) protection circuits inside the trench polysilicon (poly). Therefore, the ESD circuits are able to form without adding any extra mask layers. Such ESD can be formed for both SGT and normal trench MOSFET (i.e. a trench MOSFET without a shield electrode).

Figure 1A:
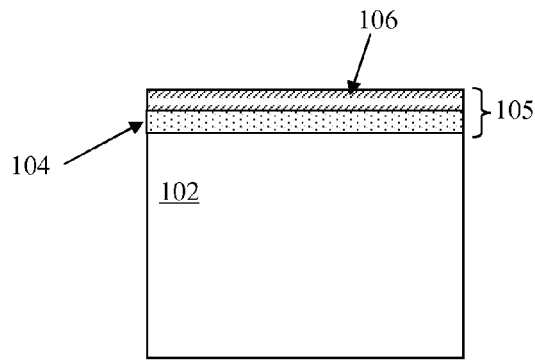
FIGS. 1A to 1L, and FIGS. 1A' to 1L' are cross sectional diagrams illustrating fabrication of a Shield Gate Trench (SGT) MOSFET with integrated electrostatic discharge (ESD) protection circuit according to an embodiment of the present invention.
Figure 1A:
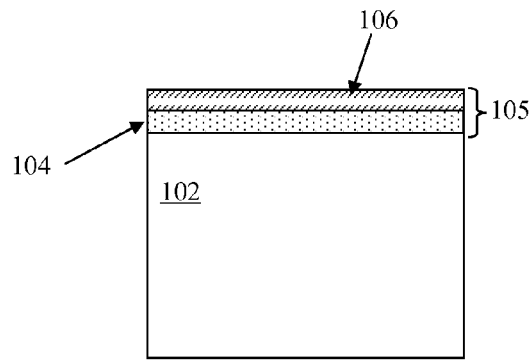
Figure 1B:
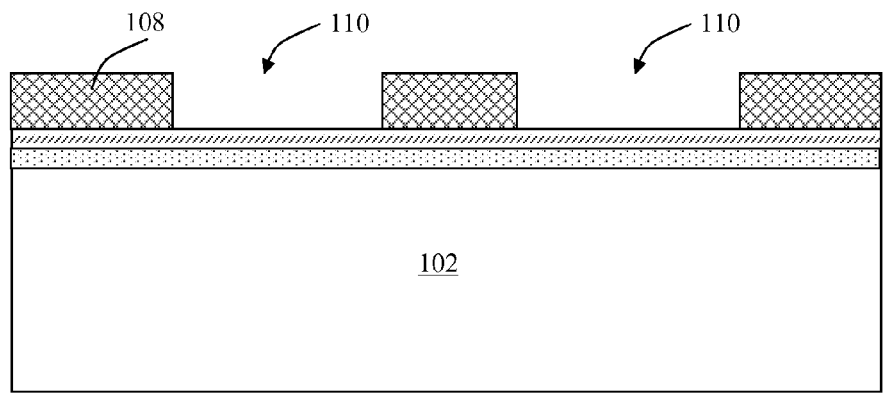
Figure 1B:
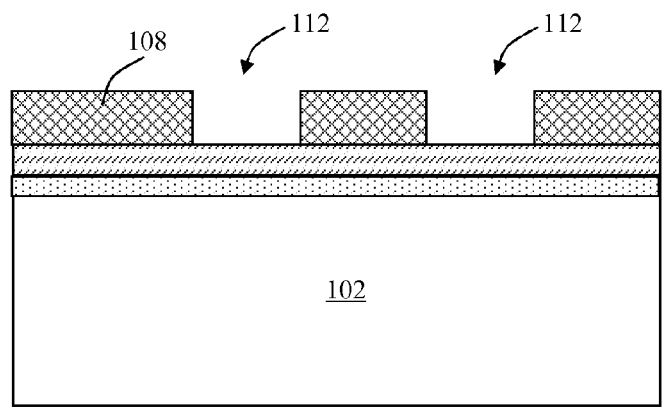

A fabrication process of the SGT trench MOSFET with integrated ESD circuit using only four masks is depicted in FIGS. 1A to 1L, and FIGS. 1A' to 1L'. By way of example, and not by way of limitation, as shown in FIG. 1A, semiconductor substrate 102 (e.g., an N type silicon bottom substrate layer with a less heavily doped N-type epitaxial (epi) layer grown on it) can be used to provide a drain of the device (e.g., for an N-channel MOSFET). It is noted that in alternative implementations, the substrate 102 could be a P type substrate with a less heavily doped P-type epitaxial layer grown on it (e.g., for a P-channel MOSFET). A hard mask layer 105 can be formed on top of the substrate 102. The hard mask layer 105 can be formed, for example, by forming a thin oxide layer 104 on the substrate 102 by deposition or thermal oxidation following by a nitride layer 106 on top of the thin oxide layer 104. FIG. 1A' shows the same structure as FIG. 1A, but is in a different portion of the semiconductor die. A photo resist (PR) layer 108 is then applied on top of the nitride layer 106 and patterned using a first mask, which is a trench mask. The residual PR layer 108 define ESD trench mask openings 110 in the ESD region and active gate trench mask openings 112 in the active region as shown in FIGS. 1B, and 1B' respectively.

Figure 1C:
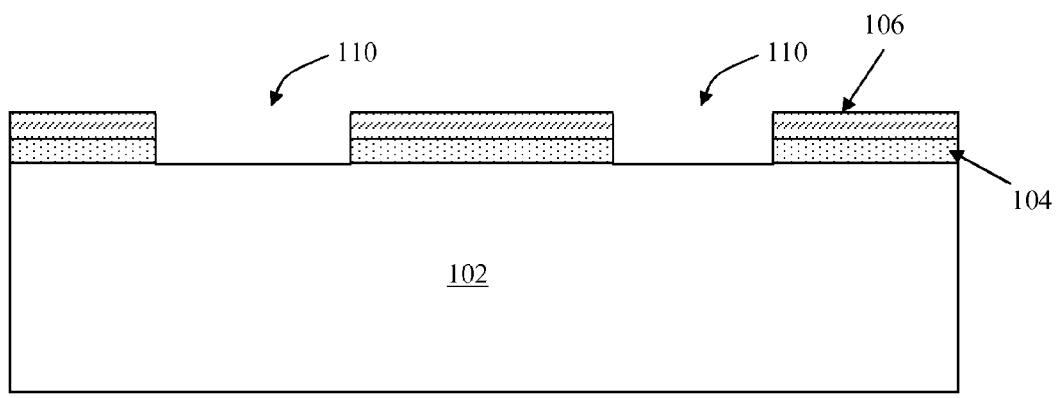
Figure 1C:
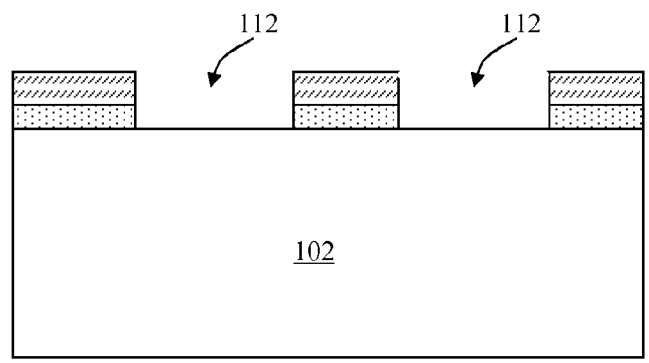

Next, a hard mask (HM) etch is performed to etch away exposed portions of the hard mask 105 (e.g., nitride layer 106 and oxide layer 104) to expose the semiconductor substrate 102 surface at the mask openings at 110 and 112. The remaining PR layer 108 is then removed, as shown in FIGS. 1C, 1C'. The remaining portions of oxide layer 104 and nitride layer 106 act as a hard mask for subsequent steps.

Figure 1D:
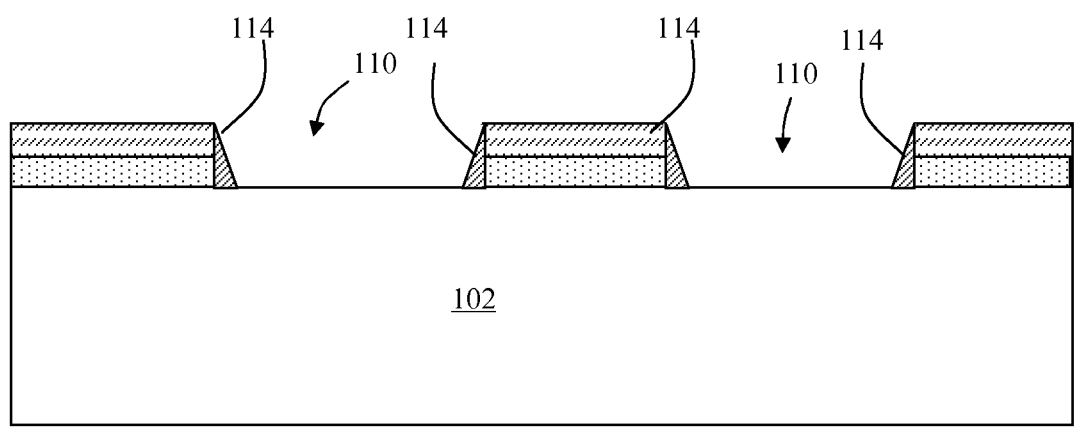
Figure 1D:
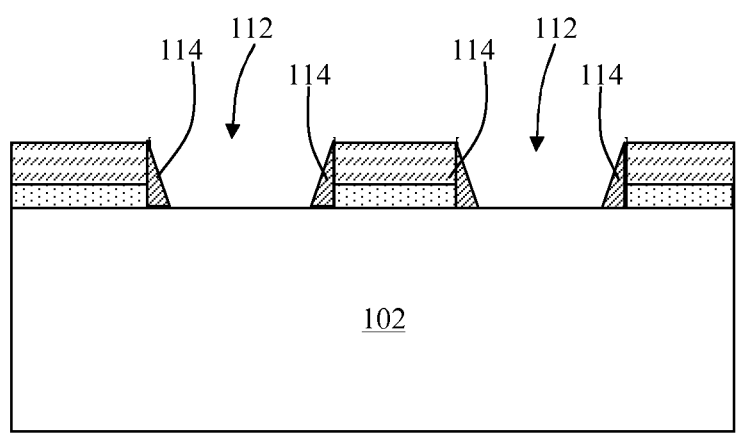

In FIGS. 1D, 1D', a layer of etch-resistant material (e.g., oxide or nitride) is deposited and anisotropically etched back along the horizontal surface. The term "etch-resistant" is used here to indicate that this material can be etched differentially, or more slowly, with respect to other materials like substrate 102. In some embodiments, the thickness of the insulating layer can be approximately 2200 Å. Etch-resistant insulating spacers 114 (sometimes referred to herein as hard mask spacers) are thus formed along the walls of the hard mask openings 110, 112 after blanket anisotropic etch back. The etch-resistant material that forms the spacers 114 is resistant to a process that etches the material of the substrate 102.

Figure 1E:
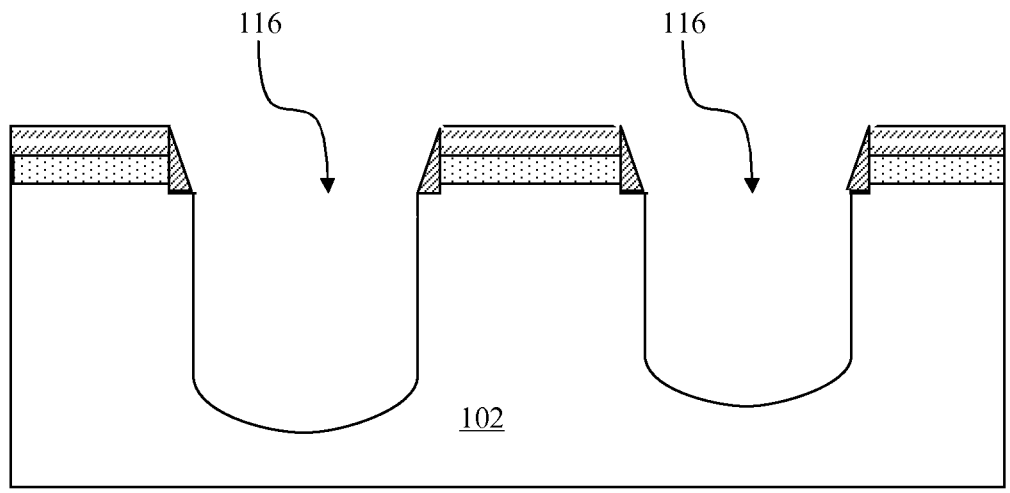
Figure 1E:
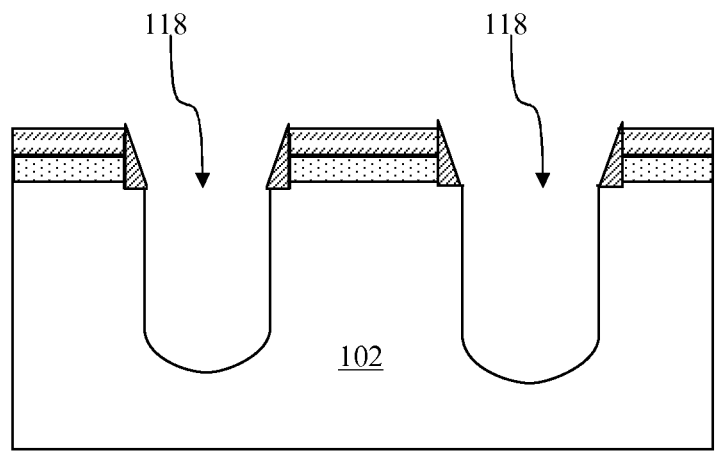

Next, a blanket etch step is performed on the substrate 102 to form the ESD trench 116 and active trenches 118 with the ESD trenches 116 wider than the active trenches 118 as shown in FIGS. 1E, 1E'. Typically, the width of the ESD trenches is approximately two times larger than the width of the active trenches. The etch-resistant spacers 114 allow for a self-aligned etching step that does not require additional mask. As will be shown later in the process, the spacers 114 preserve a spacing from the original hard mask layers 104 and 106 so that a self-aligned source/body contact trench can be formed. A wider trench opening results in a deeper trench than a narrower trench opening would have due to the nature of the silicon etch loading factor. For example, since the ESD trench opening 110 is wider than active gate trench opening 112, the resulting ESD trench 116 is etched deeper than the active gate trench 118 during the blanket etch step, as shown in FIGS. 1E, 1E'.

Figure 1F:
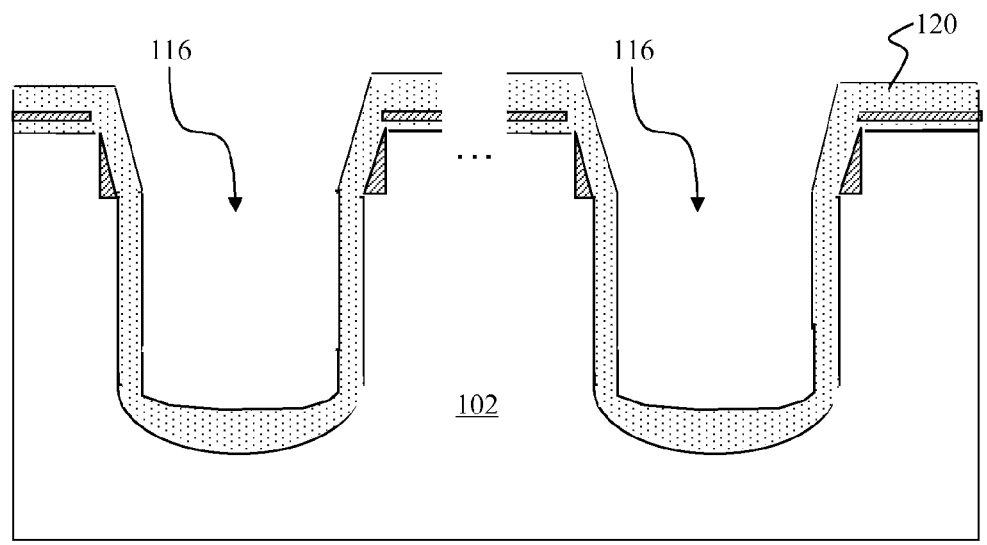
Figure 1F:
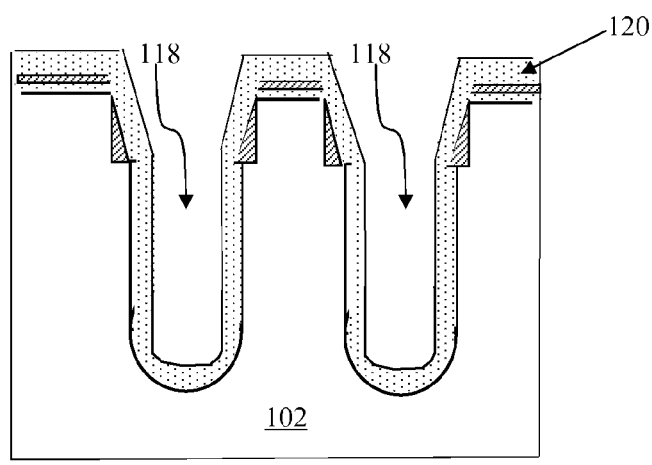

In FIGS. 1F, 1F', an insulator liner 120 (e.g., an oxide) is deposited or thermally grown on the sidewalls and the bottom of the trenches 116, 118. If deposited, the insulator liner 120 may also be formed on top of the nitride layer 106. The liner 120 is thicker than a gate insulator that will be formed later in the process. In some embodiments, a sacrificial oxide layer of approximately 500 Å may optionally be grown and removed to improve the silicon surface. By way of example, a layer of oxide of approximately 250 Å is grown, followed by forming a layer of high temperature oxide (HTO) of approximately 900 Å. For a higher voltage device, the oxide liner 120 may be thicker e.g. 1000 to 5000 Å.

Figure 1G:
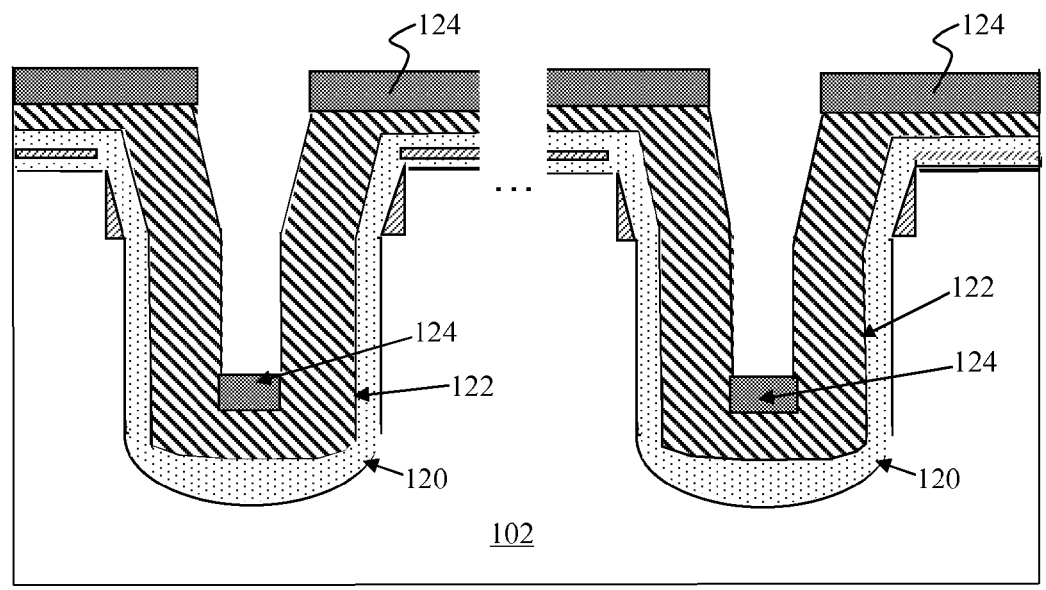
Figure 1G:
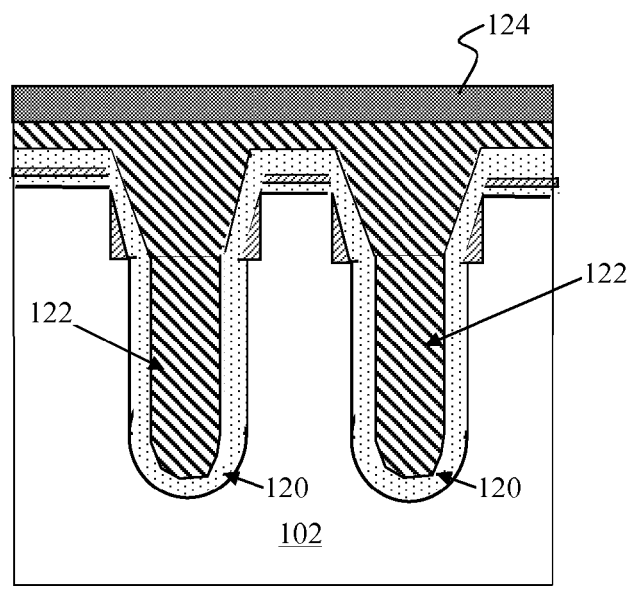

Semiconducting material 122, such as un-doped polysilicon, can be deposited, as shown in FIGS. 1G, 1G'. In some embodiments, the thickness of the conductive material is less than half the trench width of the ESD trenches 116, e.g., approximately 4000 Å to 10000 Å. The thickness of the material 122 may be selected to be less than half the width of the ESD trenches, but more than half the width of the active device trenches. The semiconducting material 122 completely fills the active device trenches 118 but only partially fills (i.e., lines) the ESD trenches 116. This layer of material is sometimes referred to as source poly, shield poly, or poly 1.

An ESD vertical dopant implant is performed to form a first part of the P-N-P (or N-P-N) junction for the ESD protection circuit. The doping is light and of a first conductivity type. The type of doping depends on whether the device is a P-channel or N-channel. A typical N-channel device can be doped, e.g., with Boron. A typical P-channel device can be doped, e.g., with Phosphorous. As shown in FIGS. 1G, 1G', because of the gap in the poly 122 in the ESD trenches 116, there is doping 124 at the bottom in the center of the trenches. Doping of portions 125 of the semiconductor 122 at the bottom of the trench is a unique structural feature. Because the conductive material 122 completely fills the active trenches 118, the doping only implants dopants 124 in the poly at the top of the active devices trenches 118. Then an annealing process is carried out to drive in and diffuse the dopants.

Figure 1H:
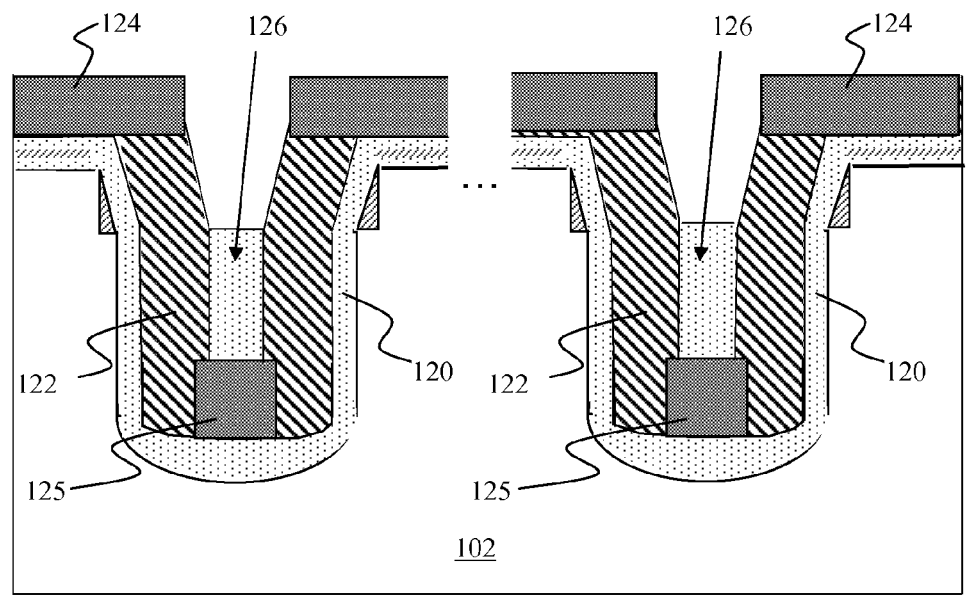
Figure 1H:
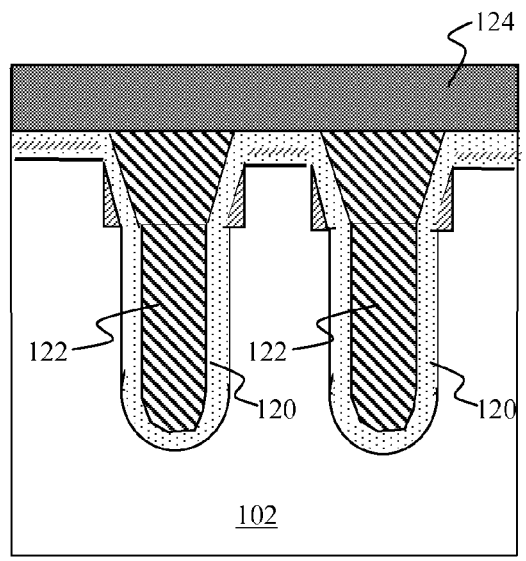

As shown in FIGS. 1H, 1H', a dielectric material 126, such as oxide, is deposited into the gaps in the ESD trenches 116 and active trenches 118 and then etched back. The dielectric material at least partially fills the gap between the polysilicon 122 lining the sides of the ESD trenches 116 and protects the doped portion 125 underneath the dielectric material 126. The dielectric material is etched away elsewhere on the die. The dielectric material can be oxide, nitride, or combination.

Figure 1I:
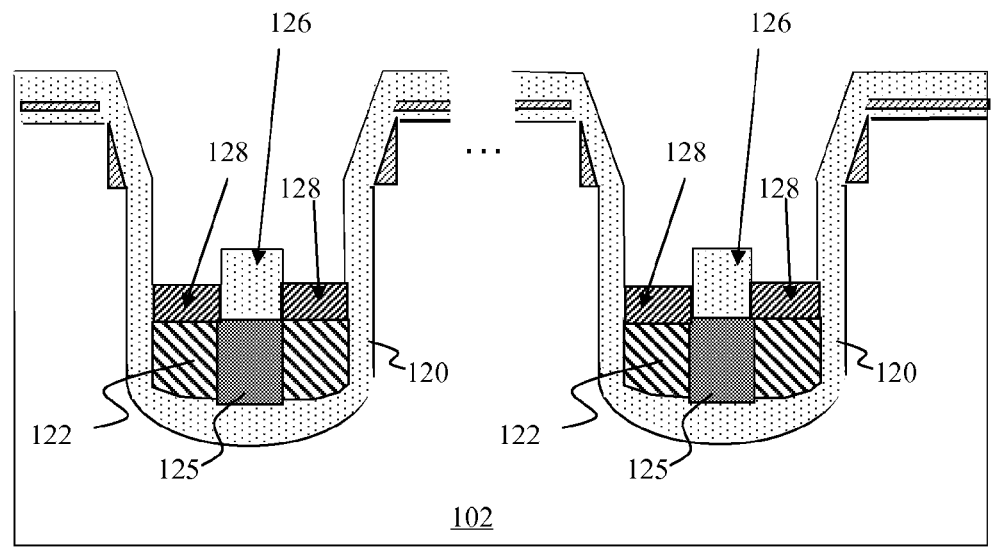
Figure 1I:
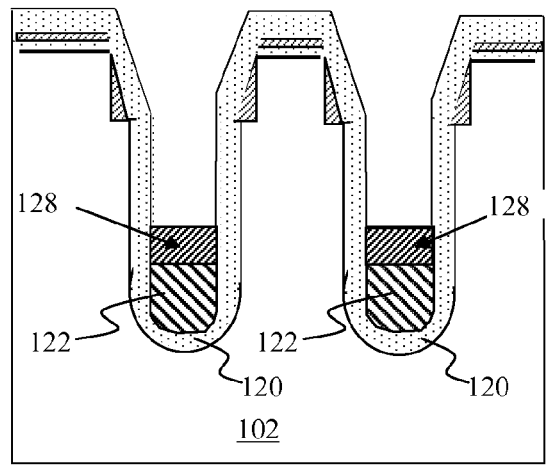

The semiconductive material 122 containing the dopants 124 at the top of the substrate 102 is then subject to a blanket etch. Such that only the lower portions of the conductive material/poly 122 within the trenches remain. The only doped portions 125 of the poly layer 122 to remain are located underneath the dielectric 126 in the ESD trenches 116. The semiconductive material 122 is etched back to a predetermined depth in both ESD trenches 116 and active trenches 118, as shown in FIGS. 1I, 1I'. The material 122 is etched all the way down to the level of the typical trench MOS bottom poly, i.e., down to the top of a shield electrode. In this embodiment, poly 1 may be etched down to about 1.4 micron below the top surface of the substrate.

Figure 1J:
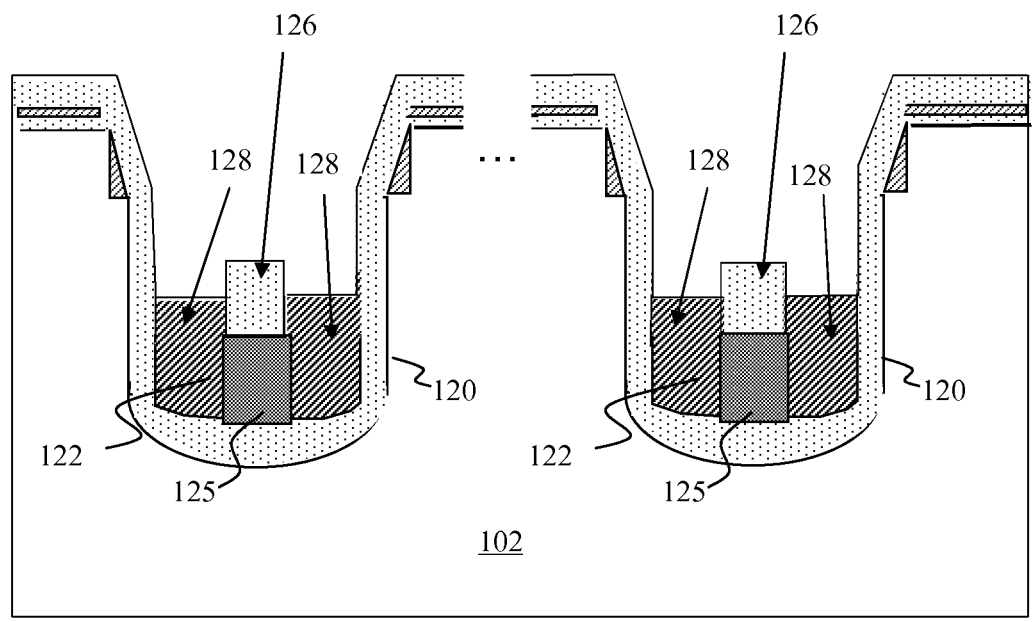
Figure 1J:
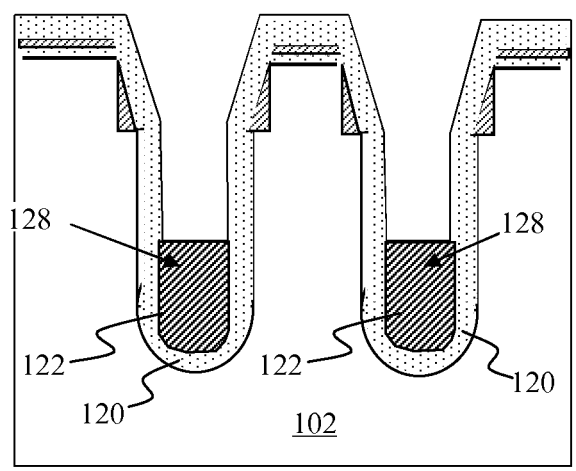

After the conductive material 122 has been etched down to the predetermined depth, a second ESD vertical implant of dopants 128 (source like implant) is then performed. The dopants 128 are of a second conductivity type, which is opposite to the first conductivity type dopants 124, with higher dose and lower energy than the first conductivity type dopants 124 implant. Then an annealing process can be carried out to drive in the dopants as shown in FIGS. 1J, 1J'. The dopants 128 make the semiconductive material in the active device trenches conductive so that it forms a shield. The same dopants also provide the other type of doping needed to form a P-N-P (or N-P-N) junction.

An insulating material 130 (e.g., an oxide) may then be deposited into the ESD trenches 116 and the active device trenches 118 with a predetermined thickness using high-density-plasma (HDP) deposition. The oxide layer 130 is etched or polished back until the top surface of the oxide 130 is even with the nitride 106 surface, which serves as an etch stop.

Figure 1K:
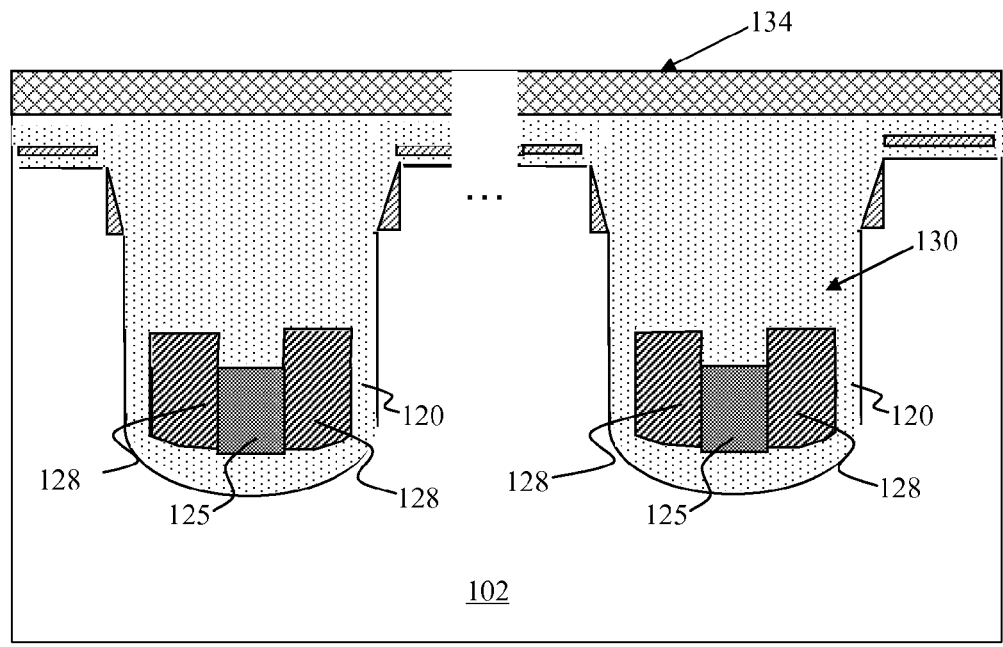
Figure 1K:
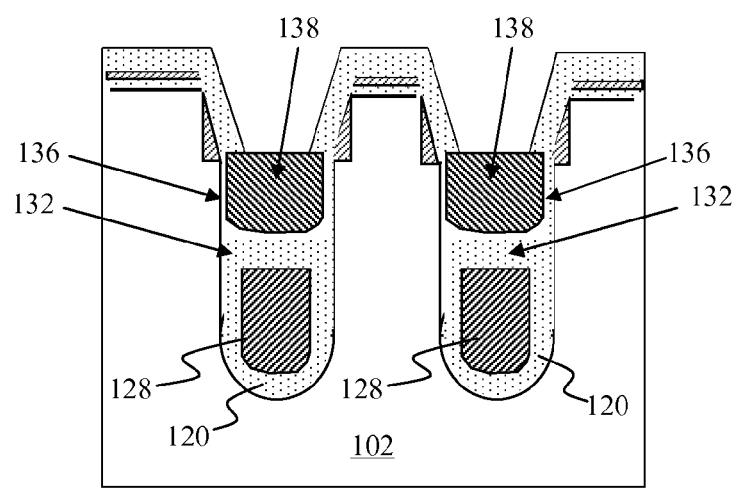

At this point, a layer of photo resist 134 is then spun on the surface of the structure and a second mask is applied (not shown). The second mask, referred to herein as a P-cover mask, covers the ESD region to protect the ESD region during subsequent processing to finish the active devices as shown in FIG. 1K. A portion of the oxide 130 not protected by the second mask will be removed by HDP wet etching. Mask overlap and wet etch undercut together help determine the final profile if forming an asymmetric oxide trench like that described in U.S. application Ser. No. 12/583,192 filed on Aug. 14, 2009. Thus, the distance of the photoresist cover extending into the active region in part determines in part how much oxide will be removed by wet etching undercut. Other factors include etch time and the thickness of the oxide layers.

An anisotropic etch (e.g., a wet etch) of the insulating material 130 may then be performed. If an asymmetric oxide trench is not required a dry etch may be used instead. Some insulating material 130 in areas unmasked by the photoresist is removed, such that the remaining insulating material 130 is held at a desired height. Some insulating material 130 near the edges of the photoresist is also removed. The amount of insulating material 130 that is etched can be controlled by adjusting the position of edge of the photoresist layer and the etch time. Extending the edge further into the active region would result in less insulating material 130 being etched, and pulling the edge away from the active region would have the opposite effect. The amount of insulating material etched away can vary in different embodiments. The insulating material 130 remaining above the doped material 128 in the active trenches, e.g., oxide layer 132, is referred to as the inter-electrode dielectric (IED) or inter-poly dielectric (IPD). The inter-electrode dielectric can range from about one hundred angstroms to about ten thousand angstroms in thickness.

The PR is then removed, and a layer of gate insulator 136 (e.g., gate oxide) is deposited or thermally grown. In some embodiments, the added gate insulator 136 can be an oxide layer approximately 450 Å thick. Thus, in FIG. 1K', gate insulators 136 are formed on the exposed trench walls of the active device trenches.

Another conductive material (e.g., polysilicon) deposition and etch back can then be performed, as seen in FIG. 1K'. By way of example, and not by way of limitation, approximately 8000 Å to 12000 Å of polysilicon can be deposited in various trenches. The deposited poly can then be etched back, forming gate electrode/poly structures, as indicated at 138. In the example shown, the gate poly surface can be recessed approximately 500-1000 Å below the top of the semiconductor substrate.

Figure 1L:
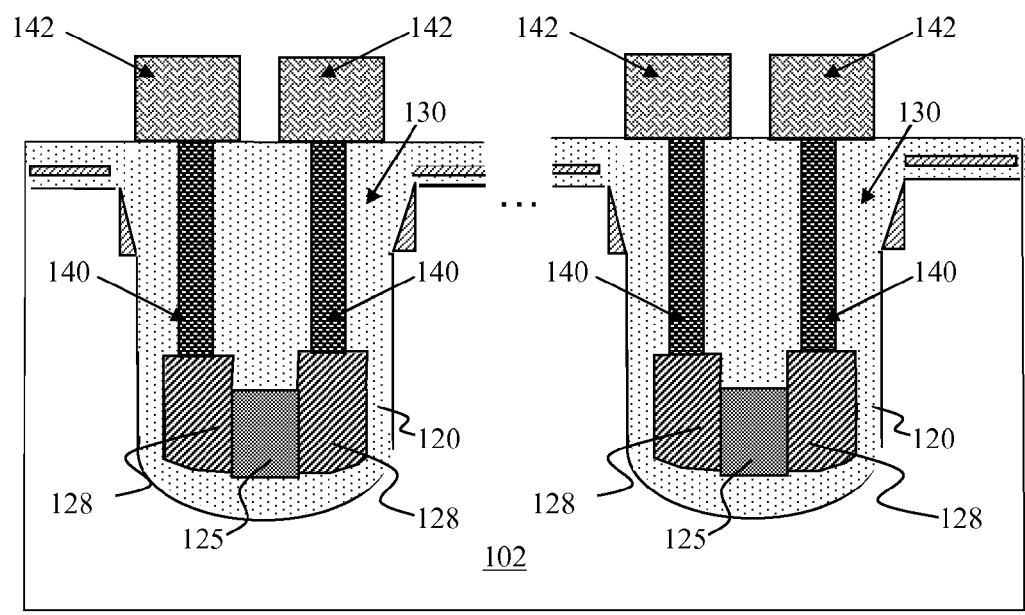
Figure 1L:
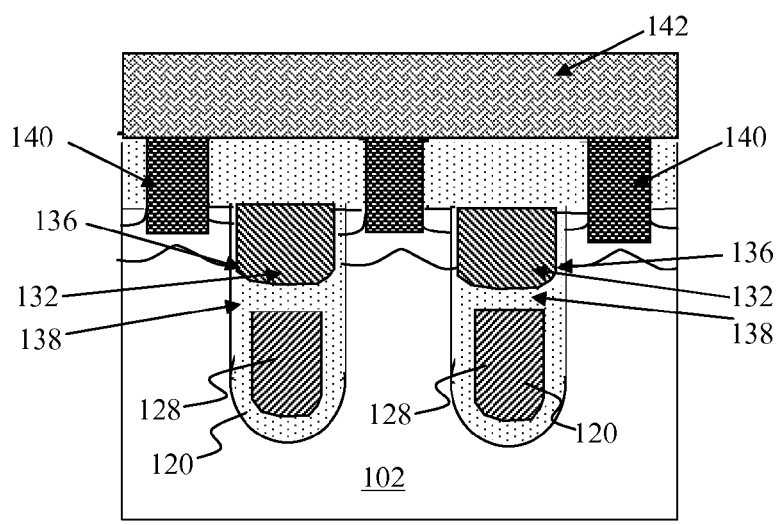

As shown in FIGS. 1L, 1L', exposed nitride spacers in the active gate trenches as well as other exposed nitride material can be removed through a wet etch process. A body implant can then take place, e.g., by bombarding the partially completed device with dopant ions. The ions may be implanted at an angle. In active areas unprotected by nitride, the implant forms body regions. In some embodiments, Boron ions with a dosage level of approximately $1.8 \times 10^{13}$ ions/cm$^2$ at 60 KeV~180 KeV are used for an N-channel device. Other types of ions can be used. For example, Phosphorous or Arsenic ions can be used to form the body regions for P-channel devices. Then, source implant takes place (e.g. with a zero tilt angle (i.e., at normal incidence)). The device is again bombarded with dopant ions. In some embodiments, Arsenic ions (e.g. for N-channel device) with a dosage level of $4 \times 10^{15}$ ions/cm$^2$ at 40 KeV~80 KeV are used to form the source. Source regions are formed within body regions. By way of example, a body diffusion step may be performed before the source implant and a source diffusion may then be performed after the source implant. No additional mask is required to implant the body and the source of the device. The body and source implants can be performed as self-aligned blanket implants.

Insulating material (e.g., oxide) may then be deposited to fill in the trench openings over the gate poly regions. In some embodiments, a chemical vapor deposition (CVD) process is used to deposit Low Temperature Oxide (LTO) and Borophosphosilicate Glass (BPSG) to a thickness of approximately 5000 Å. Next, the insulating material may be etched back through a dry etch process where the oxide is etched down and stopped by endpoint etch to surface of the substrate's surface.

Source/body contact trenches are then formed in the active regions for contact to the source and body regions. Exposed silicon areas are etched, while areas protected by oxide and/or nitride are not etched. Since the etching process does not require an additional mask, it is referred to as a self-aligned contact process. The self-aligned nature of the active cell contact trenches is made possible because the nitride spacers formed near the beginning of the process preserved the hard mask spacing.

An implant with dopants of opposite conductivity type to the substrate 102 may optionally be performed at the bottom of the source/body contact trenches for a better body contact. Barrier metal such as Ti and TiN can be deposited, followed, e.g., by rapid thermal processing (RTP) to form Ti silicide near the contact region. The thicknesses of Ti and TiN used in some embodiments can be 300 Å and 1000 Å, respectively. A metal, such as Tungsten (W), can then be blanket deposited to fill the contact trenches. In some embodiments about 4000 Å to 6000 Å of W may be deposited. The deposited metal can be etched back up to the oxide surface to form individual conductive plugs 140.

A poly pick up mask, the third PR mask, is applied at the ESD region to form the contact trenches for contact to the P-N-P (or N-P-N) junction. The exposed oxide is etched and the mask is then removed. During this step, contact trenches to contact the shield electrode, and the gate electrode may also be formed in other regions of the device (not shown).

A fourth PR mask can be used to form a source metal region and a gate metal region. Specifically, as shown in FIGS. 1L, 1L', a metal layer 142 such as Aluminum-Copper (AlCu) can be deposited over the partially completed device. By way of example, and not by way of limitation, the metal layer can be about 3 μm to about 6 μm thick. A photoresist may be formed on the metal layer 142 and patterned to form a metal mask. After the resist is developed, the metal layer 142 may be etched through openings in the metal mask to separate the metal layer 142 into source and gate metal regions. After residual photoresist is removed, the metal 142 can be annealed. In some embodiments, the metal may be annealed at 450° C. for 30 minutes. FIGS. 1L, 1L' are cross sectional diagrams illustrating an example of a completed SGT MOSFET with an integrated ESD structure. The metal mask not only separates source and gate metals but can also perform a function to link to the ESD structure. For example, the metal layer portion above one end of the ESD protection structure may be connected to the source metal, and the metal layer portion above the other end of the ESD protection structure may be connected to the gate metal. Thus the ESD trench provides a P-N-P (or N-P-N) junction protection structure between the source and the gate of the device. In case of an ESD event, the excess current and voltage may be diverted between source and gate metal through the ESD protection structure, thus safely bypassing the active area of the device.

Figure 2B:
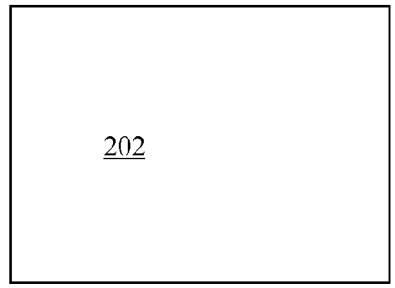
Figure 2B:
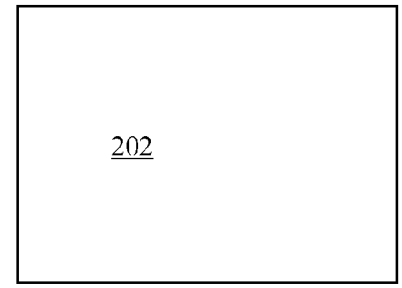
Figure 2B:
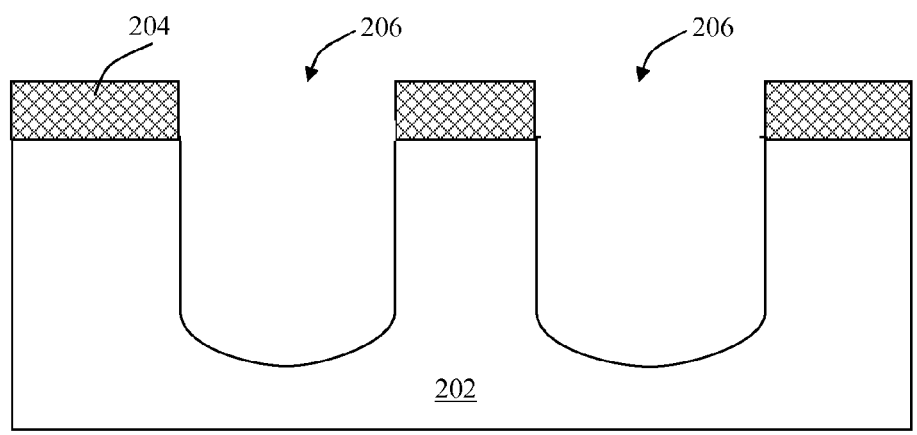
Figure 2B:
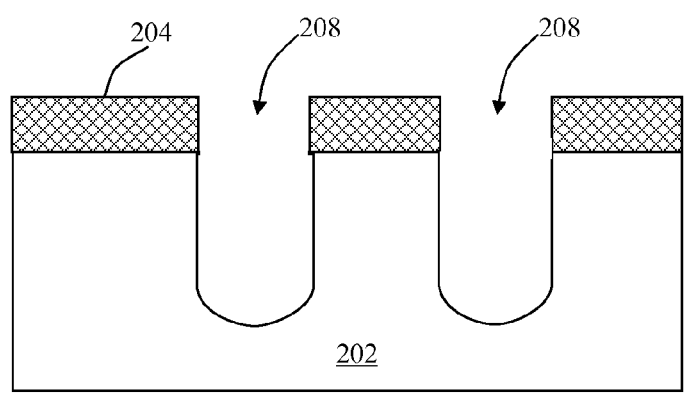

Embodiments of the present can be implemented with other types of trench MOSFETs. For example, FIG. 2A to FIG. 2J, and FIG. 2A' to FIG. 2J' illustrate a process for fabricating a normal trench MOSFET with an integrated ESD using four masks. As shown in FIG. 2A, a semiconductor substrate 102 (e.g., an N type silicon bottom substrate layer with a less heavily doped N-type epi layer grown on it (for N-channel devices)) is used as the drain of the device. FIG. 2A' shows the same structure as FIG. 2A, but is in a different portion of the semiconductor die. A hard mask can optionally be formed on top of the substrate 202 to help etch the trenches in the following step. A photo resist (PR) layer 204 is then applied on top of the substrate 202 and patterned using a first mask, which is a trench mask.

Next, a semiconductor etch is performed to etch away exposed portions of the semiconductor substrate 202 surface to form the ESD trench 206 and active trenches 208 with the ESD trenches 206 wider than the active trenches 208 as shown in FIGS. 2B, 2B' respectively. (If a hard mask was employed a hard mask (HM) etch would first be performed to form openings in the hard mask layer). A wider trench opening results in a deeper trench than a narrower trench opening due to the nature of the silicon etch loading factor. For example, since ESD trench 206 is wider than active gate trench 208, the resulting ESD trench 206 is deeper than active gate trench 208 during the etch step, as shown in FIGS. 2B, 2B'.

Figure 2C:
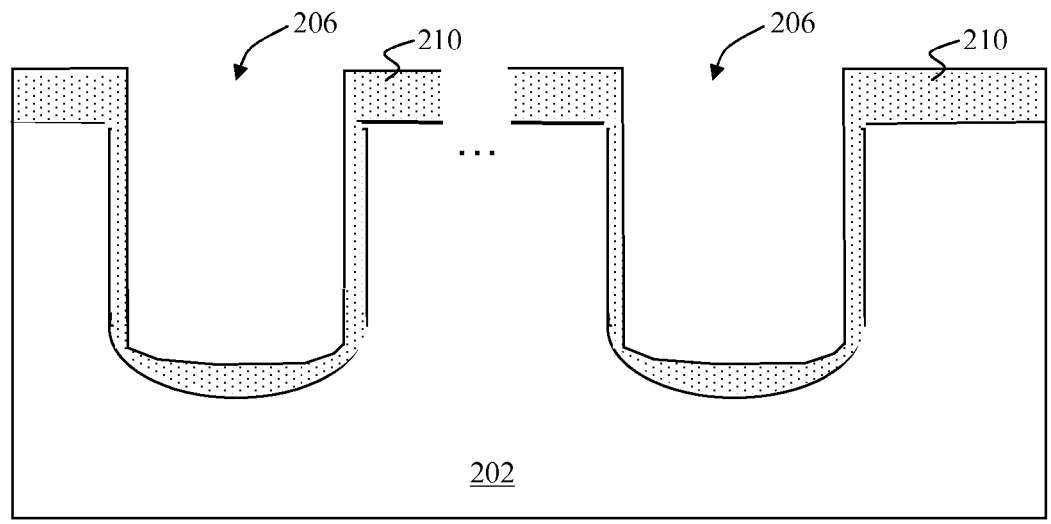
Figure 2C:
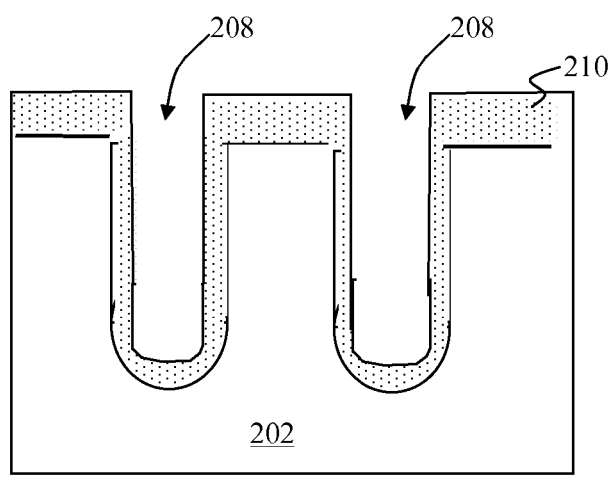
Figure 2D:
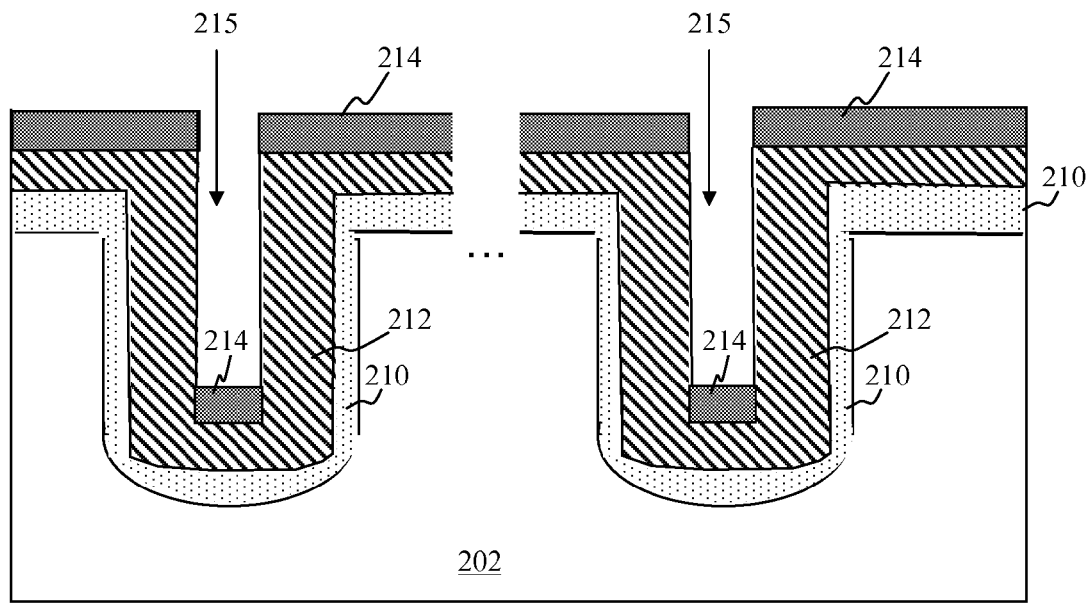
Figure 2D:
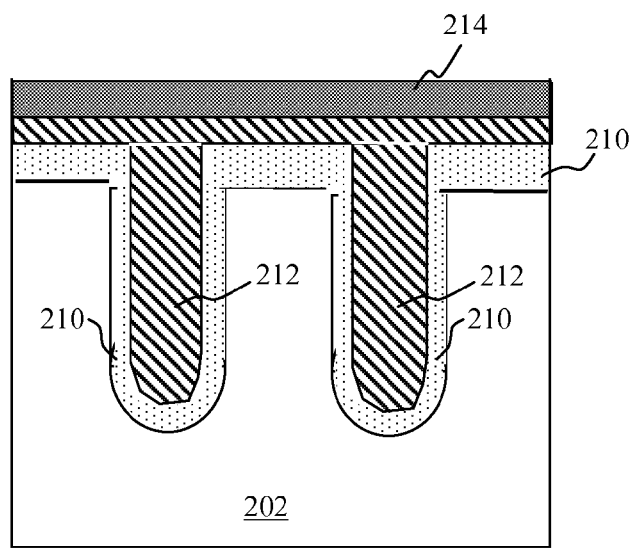

In FIGS. 2C, 2C', gate insulator 210 is deposited or thermally grown on the sidewalls and the bottom of the trenches 206, 208. Conductive or semidconductor material 212, such as undoped polysilicon, can be deposited, as shown in FIGS. 2D, 2D'. The thickness of the conductive material 212 is less than half the trench width of the ESD trenches 206, but greater than half the width of the active trenches 208, e.g., approximately 4000 Å to 10,000 Å, which completely fills the active device trenches 208 but only partial fills the ESD trenches 206. Since the material 212 only lines the sidewalls and bottom of ESD trench 206, a gap 215 remains in the center of the trench, between portions of the conductive material 212.

ESD vertical implant is performed to form a first part of the P-N-P (or N-P-N) junction. The doping is light and of a first conductivity type. The type of doping depends on whether the device is a P-channel or N-channel. At this step, an N-channel device is doped with Boron. A P-channel device is doped with Phosphorous. As shown in FIGS. 2D, 2D', because of the gap in the poly in the ESD trenches 206, there is a doped portion 214 formed at the bottom of the trenches. The doping of the material 212 at bottom of the trench with dopants to form the doped portion 214 is believed to be a unique structural feature. Because the conductive or semiconductor material 212 completely fills the active trenches 208, the dopants 214 are only implanted at the top portions of the poly above the active device trenches 208.

Figure 2E:
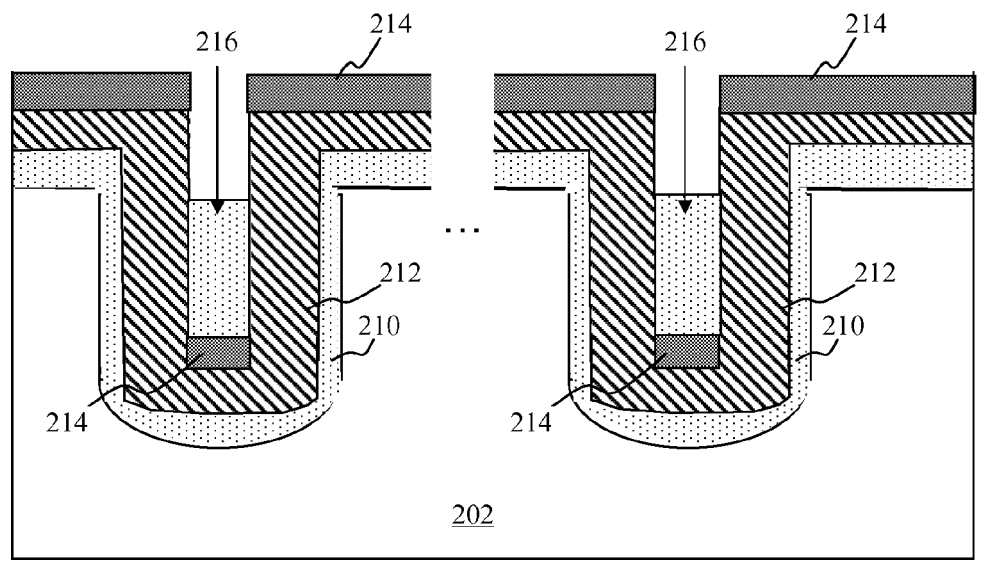
Figure 2E:
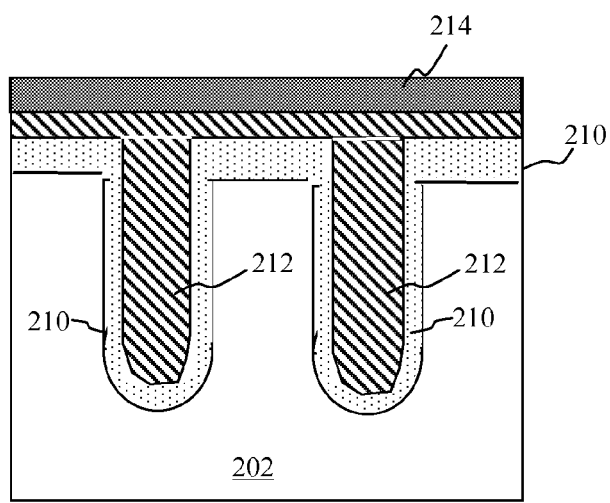

As shown in FIGS. 2E, 2E', insulating material 216 (e.g., oxide) is deposited and then etched back. This leaves insulating material 216 at least partially filling the gaps 215 in ESD trenches 206.

Figure 2F:
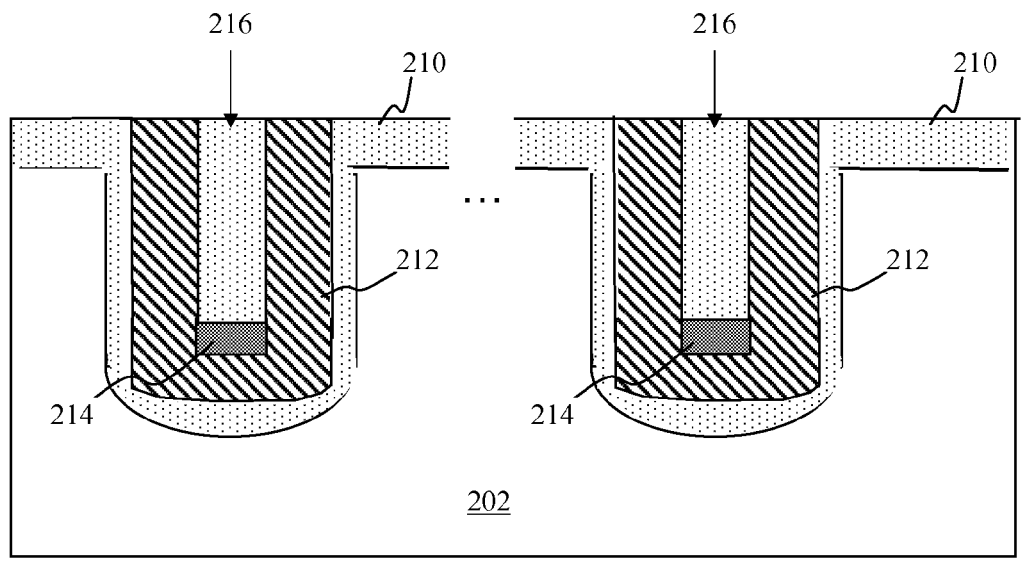
Figure 2F:
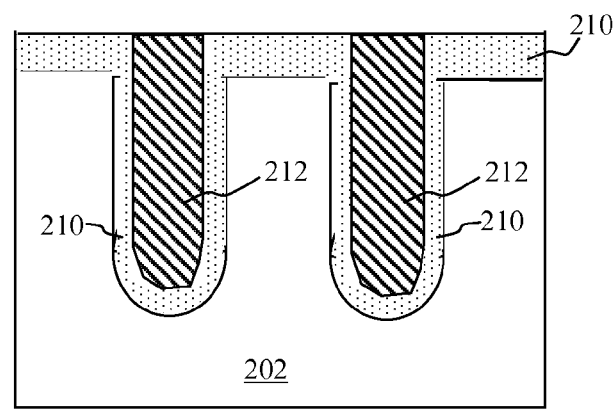
Figure 2G:
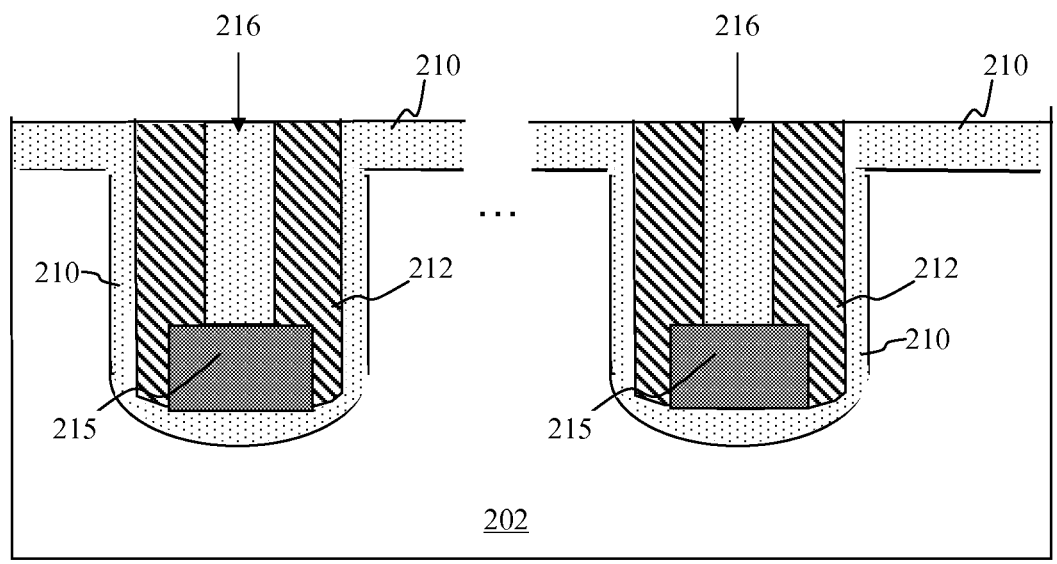
Figure 2G:
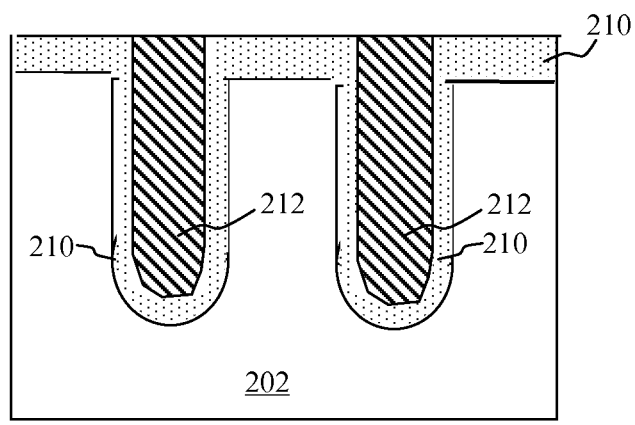

The conductive material 212 at the top of the substrate, including doped poly 214 at the top of the substrate is etched as shown in FIGS. 2F, 2F'. The conductive material 212 may be etched (or planarized) with an endpoint above the top surface of the substrate. Then an annealing process is carried out to drive in the dopants of the doped poly 214 resulting in extended doped portions 215 at the bottom of the ESD trenches 206 as shown in FIG. 2G, 2G'.

Figure 2H:
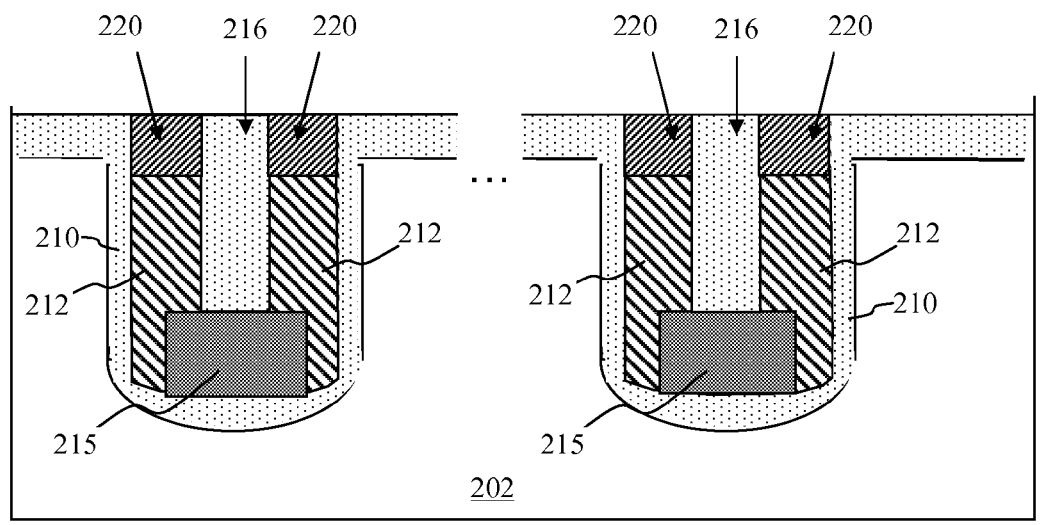
Figure 2H:
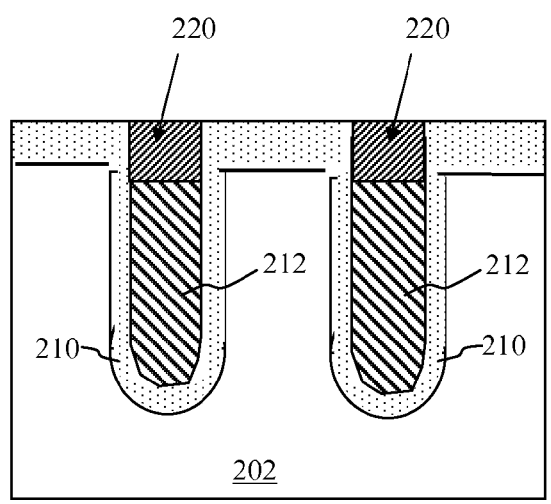
Figure 2I:
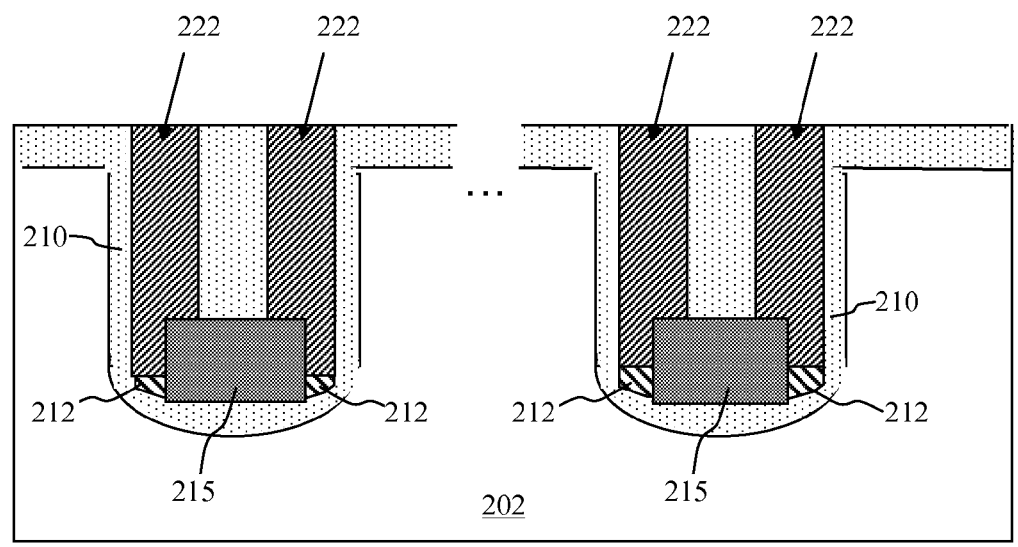
Figure 2I:
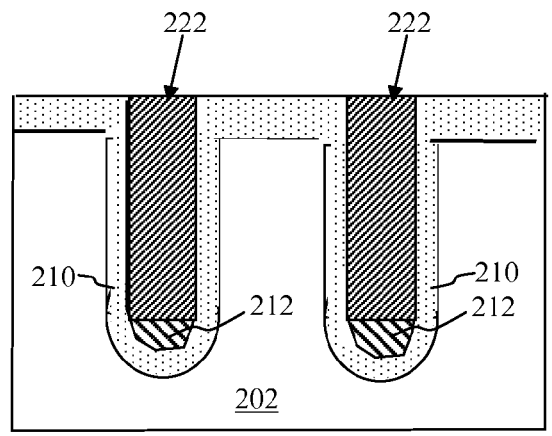

A second ESD vertical implant (same conductivity type as source) is performed to dope upper portions 220 of the material 212 in the ESD trenches. The doped portions 220 are doped with dopants of a second conductivity type, which is opposite to the first conductivity type of first implanted dopants 214, and the implantation is performed with high dose and low energy as shown in FIGS. 2H, 2H'. Then an annealing process is carried out to drive in the dopants resulting in extended doped portions 222 as shown in FIGS. 2I, 2I'. In this embodiment the annealing process for doping the portions 220 may be longer than for the first implanted dopants 214 at the top of the poly. The resulting extended doped portions 222 provides the other type of doping needed to form the P-N-P (or N-P-N) junction with the doped portion 214 at the bottom the ESD trench.

A body implant can then take place, e.g., by bombarding the partially completed device with dopant ions. The ions may be implanted at an angle. In some embodiments, Boron ions with a dosage level of approximately $1.8 \times 10^{13}$ ions/cm$^2$ at 60 KeV~180 KeV are used for an N-channel device. Other types of ions can be used. For example, Phosphorous or Arsenic ions can be used to form the body regions for P-channel devices. Then, source implant takes place (e.g. with a zero tilt angle (i.e., at normal incidence)). The device is again bombarded with dopant ions. In some embodiments, Arsenic ions with a dosage level of $4 \times 10^{15}$ ions/cm$^2$ at 40 KeV~80 KeV are used (e.g. for an N-channel device). Source regions are formed within body regions. By way of example, a body diffusion step may be performed before the source implant and a source diffusion may then be performed after the source implant.

Source/body contact trenches (optional) may be then formed in the active regions for contact to the source and body regions. A dopant implant of a type opposite the doping of the substrate 202 may optionally be performed at the bottom of the contact trenches for a better body contact. Barrier metal such as Ti and TiN can be deposited, followed, e.g., by rapid thermal processing (RTP) to form Ti silicide near the contact region. The thicknesses of Ti and TiN used in some embodiments can be 300 Å and 1000 Å, respectively. Metal, such as Tungsten (W), can then be blanket deposited. The metal can be blanket deposited into the contact trenches. In some embodiments about 4000 Å to 6000 Å of W may be deposited. The deposited W can be etched back up to the oxide surface to form individual W plugs 226.

Insulating material 224 (e.g., oxide) is deposited to cover the gate poly regions, the ESD poly regions and the substrate. In some embodiments, a chemical vapor deposition (CVD) process is used to deposit Low Temperature Oxide (LTO) and Borophosphosilicate Glass (BPSG) to a thickness of approximately 5000 Å. Next, the insulating material 224 is etched back through a dry etch process where the oxide is etched down and stopped by endpoint etch to surface of the substrate's surface.

Contact trenches for contact to the P-N-P (or N-P-N) junction are formed in the ESD region. A PR contact mask is applied to define gate pickups for active devices and contact trenches for the ESD structure. The exposed oxide and the silicon are etched and the mask is then removed.

Figure 2J:
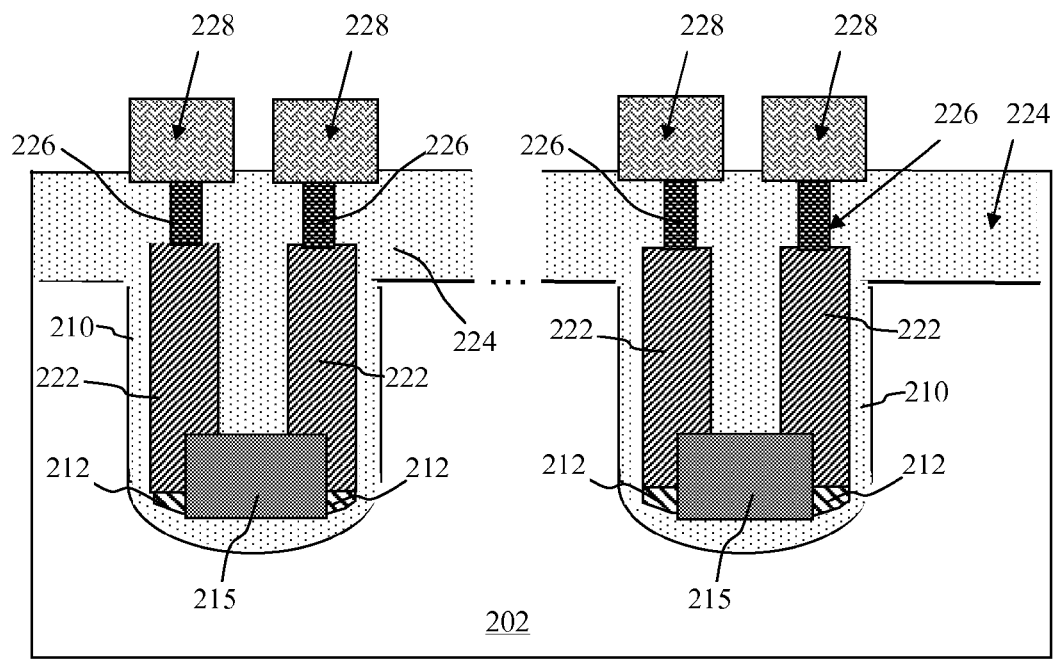
Figure 2J:
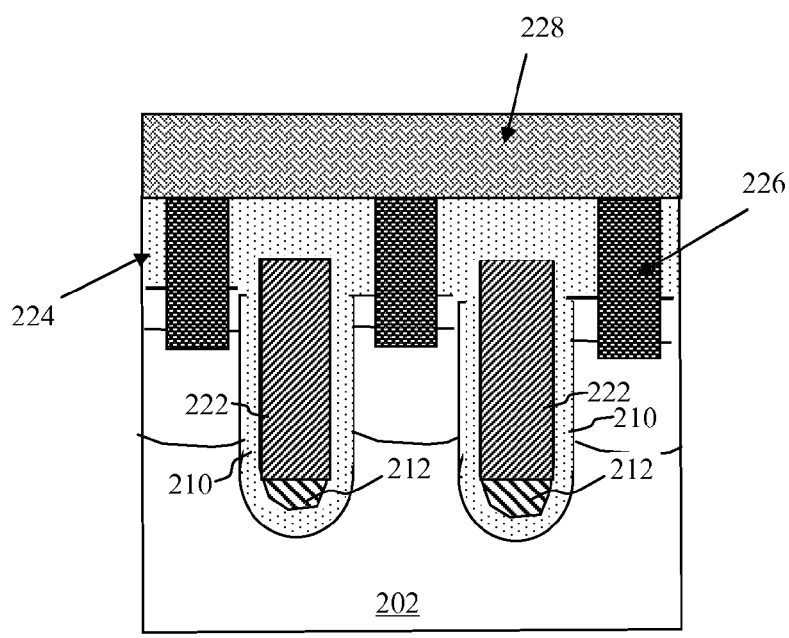

A metal mask can be used to form a source metal region and a gate metal region. Specifically, as shown in FIGS. 2J, 2J', a metal layer 228 such as Aluminum-Copper (AlCu) can be deposited and etched through a metal mask, formed, e.g., by a patterned photoresist. By way of example, and not by way of limitation, the metal layer can be about 3 μm to about 6 μm thick. After residual photoresist is removed, the metal can be annealed. In some embodiments, the metal may be annealed at 450° C. for 30 minutes. FIGS. 2J, 2J' are cross sectional diagrams illustrating an example of a completed MOSFET with an integrated ESD structure.

For example, a metal layer portion above one end of the ESD protection structure may be connected to the source metal, and the metal layer portion above the other end of the ESD protection structure may be connected to the gate metal. Thus the ESD trench provides a P-N-P (or N-P-N) junction protection structure between the source and the gate of the device. In case of an ESD event, the excess current and voltage may be diverted between source and gate metal through the ESD protection structure, thus safely bypassing the active area of the device.

In the methods of the invention, under a given artificial thermal budget the right width for the trench can be determined to form the right ESD structure with high leakage protection. However, the depletion zone has to be wide enough for the P-N-P structure to work.

The unique feature of the PNP (or NPN) ESD structure formed by the above methods is that the PNP (or NPN) structure in the trench is formed horizontally with differently doped regions side by side across a width of the trench.

Though the paragraphs above describe an ESD structure with a trench MOSFET, the structure used to form the ESD structure can also be applied to other devices, such as an IGBT, or a non-trench MOSFET.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A semiconductor device, comprising:
a semiconductor material disposed in a trench in a semiconductor substrate, wherein the semiconductor material is located at least at a bottom of the trench, wherein the semiconductor material includes differently doped regions configured as a PNP or NPN structure formed in the trench with differently doped regions located side by side across a width of the trench.

2. The device of claim 1, further comprising an additional semiconductor device formed in additional trenches in the semiconductor substrate.

3. The device of claim 1, wherein the additional semiconductor device is metal oxide semiconductor field effect transistor (MOSFET) or insulated gate bipolar transistor (IGBT).

4. The device of claim 1, wherein the N-P-N or P-N-P structure is part of an electrostatic discharge (ESD) protection structure for the additional semiconductor device, wherein the first and second portions of the semiconductor material are electrically connected to the additional semiconductor device.

5. The device of claim 4, wherein the additional semiconductor device includes a source and a gate, wherein one side of ESD protection structure is connected to source, the other side is connected to gate.

6. The device of claim 5, wherein the additional semiconductor device is a shielded gate transistor (SGT) device having a shield electrode formed in a common trench with the gate, wherein the gate is electrically isolated from the shield electrode by an inter-electrode dielectric.

7. The device of claim 1, wherein the PNP or NPN structure includes first doped semiconductor regions along sidewalls of the trench and an oppositely-doped second semiconductor region located between the first semiconductor regions with a dielectric material filling a gap between the first semiconductor regions and above the second semiconductor region.

8. The device of claim 1, wherein the semiconductor material disposed in the trench is polysilicon.

9. The device of claim 1, further comprising an insulator material lining the bottom and sidewalls of the trench between the semiconductor material disposed in the trench and the semiconductor substrate.

* * * * *